(12) United States Patent
Asao et al.

(10) Patent No.: US 7,414,879 B2
(45) Date of Patent: Aug. 19, 2008

(54) SEMICONDUCTOR MEMORY DEVICE

(75) Inventors: Yoshiaki Asao, Sagamihara (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 11/313,847

(22) Filed: Dec. 22, 2005

(65) Prior Publication Data

US 2007/0091673 A1    Apr. 26, 2007

(30) Foreign Application Priority Data

Oct. 21, 2005   (JP) .............................. 2005-306938

(51) Int. Cl.
  *G11C 11/00*   (2006.01)
(52) U.S. Cl. .................. 365/158; 365/171; 365/173
(58) Field of Classification Search ................. 365/158, 365/171, 173
  See application file for complete search history.

(56) References Cited

U.S. PATENT DOCUMENTS

| | | | |
|---|---|---|---|
| 6,211,559 B1 | 4/2001 | Zhu et al. | |
| 6,826,076 B2 | 11/2004 | Asano et al. | |
| 7,042,753 B2 * | 5/2006 | Horiguchi | 365/130 |
| 7,145,795 B2 * | 12/2006 | Ghodsi | 365/158 |
| 7,251,152 B2 * | 7/2007 | Roehr | 365/100 |

* cited by examiner

*Primary Examiner*—Son Dinh
*Assistant Examiner*—Nam Nguyen
(74) *Attorney, Agent, or Firm*—Oblon, Spivak, McClelland, Maier & Neustadt, P.C.

(57) ABSTRACT

A semiconductor memory device includes a memory cell block including a plurality of memory cells connected in series between first node and second node, the memory cells including a magnetoresistive element and a switching transistor, which are connected in parallel, the magnetoresistive element being a spin injection type and including a fixed layer whose magnetization direction is fixed, a recording layer whose magnetization direction changes, and a non-magnetic layer interposed between the fixed layer and the recording layer, a bit line connected to the first node via a selection transistor, a word line connected to a gate of the switching transistor, and a write line connected to the second node.

10 Claims, 3 Drawing Sheets

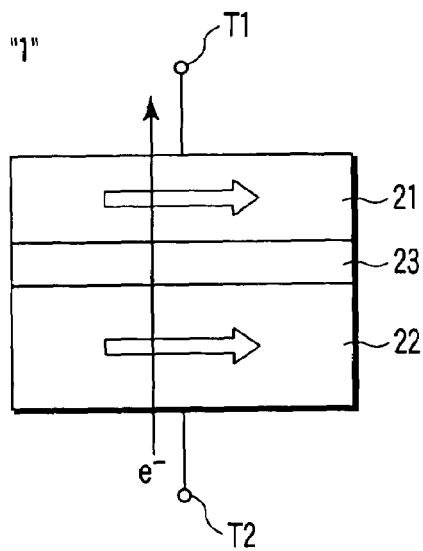
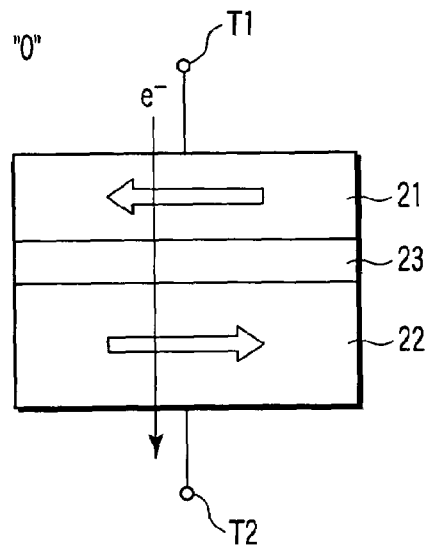
F I G. 2    F I G. 3
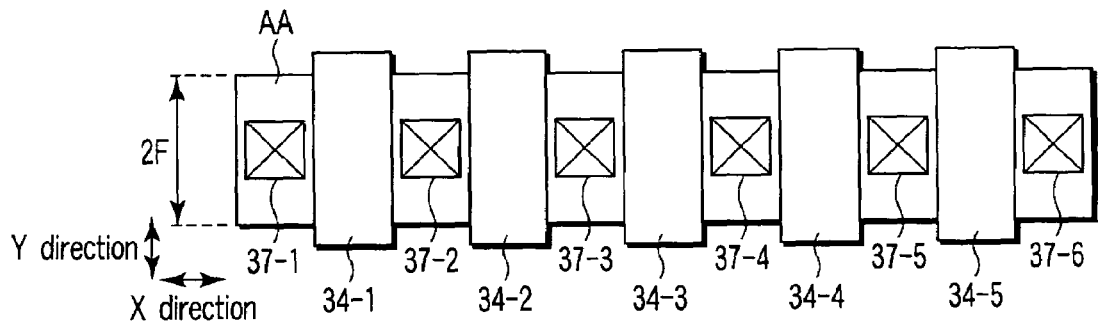
F I G. 5
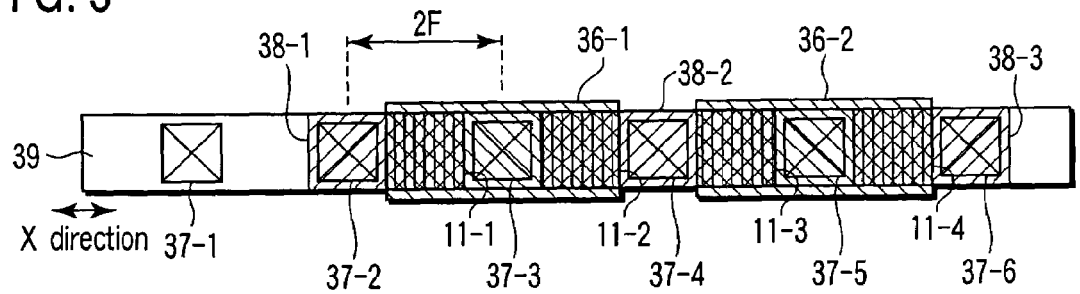
F I G. 6
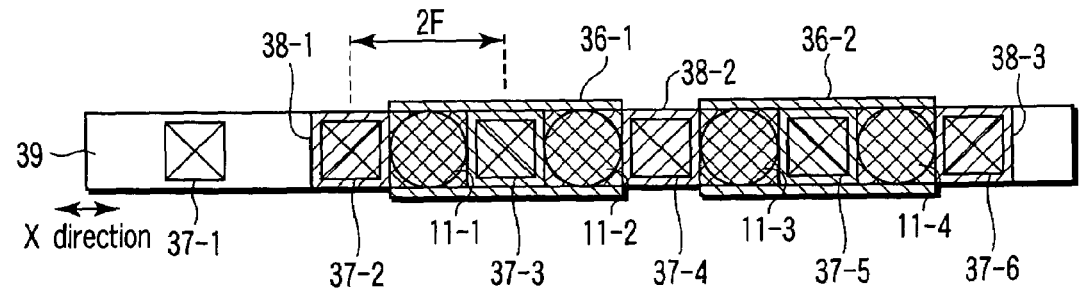
F I G. 7

SEMICONDUCTOR MEMORY DEVICE

CROSS-REFERENCE TO RELATED APPLICATIONS

This application is based upon and claims the benefit of priority from prior Japanese Patent Application No. 2005-306938, filed Oct. 21, 2005, the entire contents of which are incorporated herein by reference.

BACKGROUND OF THE INVENTION

1. Field of the Invention

The present invention relates to a semiconductor memory device. In particular, the present invention relates to the semiconductor memory device including a memory cell having a recording layer whose resistance value changes and which records data.

2. Description of the Related Art

There has been known a magnetic memory device as one of a semiconductor memory device. Various types of magnetic memory devices have been conventionally proposed. Recently, a magnetic random access memory (MRAM) using a magnetoresistive element having giant magnetoresistive (GMR) effect has been proposed. A magnetic random access memory using ferromagnetic tunnel junction has attracted special interest.

For example, the ferromagnetic tunnel junction is composed of three layers, that is, first ferromagnetic layer, insulating layer and second ferromagnetic layer, and current flows using the insulating layer as a tunnel. In this case, the junction resistance value changes in accordance with a cosine of relative angle in the magnetization directions of the first and second ferromagnetic layers. Therefore, the junction resistance value takes the minimum value when the magnetization directions of the first and second ferromagnetic layers are parallel. On the other hand, the junction resistance value takes when the maximum value when the magnetization directions are anti-parallel. This calls tunneling magnetoresistive (TMR) effect. In this case, according to the TMR effect, a change of the junction resistance value exceeds 70% in room temperature.

In general, in order to write data in a TMR element, write current flows through a write line provided in the vicinity of the TMR element to generate a magnetic field generated from the write line. Then, the magnetic field thus generated is used. In this case, there is a need of providing the write line for generating magnetic field; for this reason, the MRAM size increases.

On the other hand, in order to read data from the TMR element, a switching element is serial-connected to the TMR element, and only switching element connected to a selected read word line is turned on to make a current path. As a result, current flows in the selected TMR element only; therefore, data of the TMR element is read. However, one switch element exists in each cell, and thereby, it is apparent that the cell area increases.

Moreover, an MRAM capable of improving memory capacity has been disclosed as this kind of related technique (see JPN. PAT. APPLN. KOKAI Publication No. 2004-213744).

BRIEF SUMMARY OF THE INVENTION

According to a first aspect of the present invention, there is provided a semiconductor memory device comprising: a memory cell block including a plurality of memory cells connected in series between first node and second node, the memory cells including a magnetoresistive element and a switching transistor, which are connected in parallel, the magnetoresistive element being a spin injection type and including a fixed layer whose magnetization direction is fixed, a recording layer whose magnetization direction changes, and a non-magnetic layer interposed between the fixed layer and the recording layer; a bit line connected to the first node via a selection transistor; a word line connected to a gate of the switching transistor; and a write line connected to the second node.

According to a second aspect of the present invention, there is provided a semiconductor memory device comprising: a memory cell block including a plurality of memory cells connected in series between first node and second node, the memory cells including a phase change element and a switching transistor, which are connected in parallel, the phase change element changing in its phase into a crystalline state and an amorphous state; a bit line connected to the first node via a selection transistor; a word line connected to a gate of the switching transistor; and a write line connected to the second node.

According to a third aspect of the present invention, there is provided a semiconductor memory device comprising: a memory cell block including a plurality of memory cells connected in series between first node and second node, the memory cells including a recording element and a switching transistor, which are connected in parallel, the recording layer whose resistance value changes by a sign of a supplied voltage pulse; a bit line connected to the first node via a selection transistor; a word line connected to a gate of the switching transistor; and a write line connected to the second node.

BRIEF DESCRIPTION OF THE SEVERAL VIEWS OF THE DRAWING

FIG. 2 is a cross-sectional view to explain the case of writing data 1 in an MTJ element 11;

FIG. 3 is a cross-sectional view to explain the case of writing data 0 in the MTJ element 11;

FIG. 5 is a plan view showing the lower layer section of the MRAM shown in FIG. 4;

FIG. 6 is a plan view showing the upper layer section of the MRAM shown in FIG. 4;

FIG. 7 is a plan view showing another MTJ element 11;

DETAILED DESCRIPTION OF THE INVENTION

Figure 1:
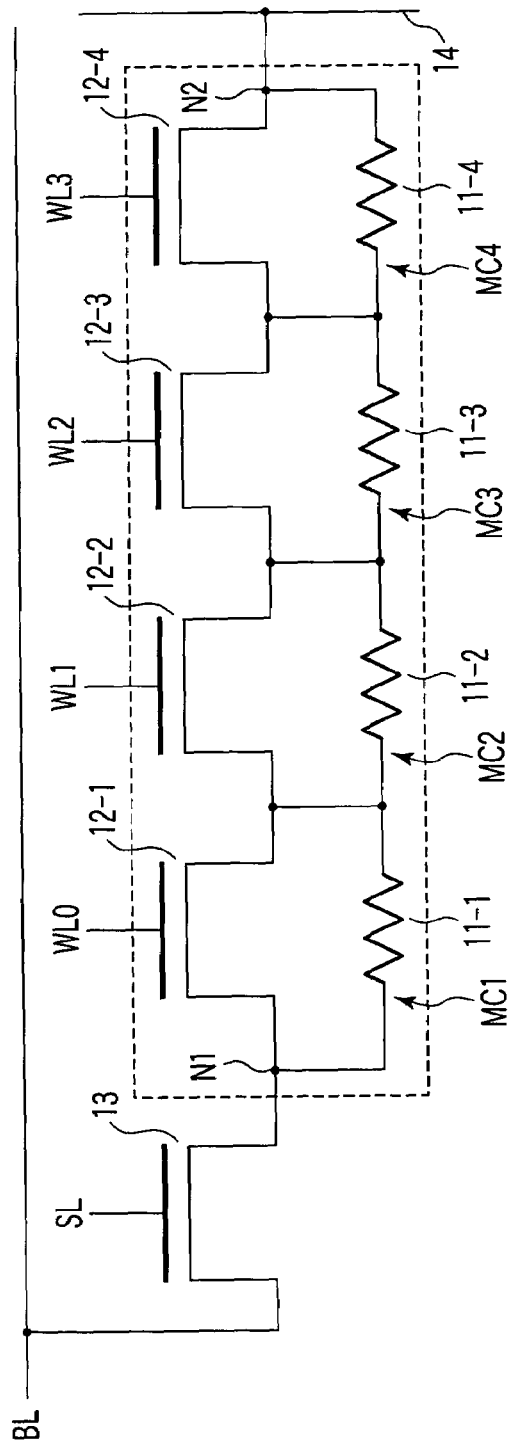
FIG. 1 is a circuit diagram showing an MRAM according to a first embodiment of the invention.

Embodiments of the present invention will be described below with reference to the accompanying drawings. In the following description, the same reference numerals are used to designate elements having the identical function and configuration, and the repeated explanation will be made if necessary.

(First Embodiment)

FIG. 1 is a circuit diagram showing an MRAM according to a first embodiment of the invention. The MRAM includes a memory cell array comprising a plurality of memory cell blocks BLK. The memory cell array is provided with a plurality of bit lines BL0 to BLn each extending to an X direction. Moreover, the memory cell array is provided with a plurality of word lines WL0 to WLn each extending to a Y direction perpendicular to the X direction. The following is an explanation about one memory cell block BLK. Thus, FIG. 1 shows the configuration of one memory cell block. The configuration of other memory cell blocks is the same as shown in FIG. 1.

The memory cell block BLK includes a plurality of memory cells MC (four memory cells MC1 to MC4 are shown as one example in this embodiment), which are serial-connected between nodes N1 and N2. The memory cell MC1 has MTJ (Magnetic tunnel Junction) element 11-1 and switching transistor 12-1 functioning as a switching element. The foregoing MTJ element 11-1 and switching transistor 12-1 are connected in parallel. Memory cells MC2 to MC4 each have the same configuration as described above. The memory cell block BLK has a so-called chain structure, in which four memory cells MC1 to MC4 are serial-connected.

The gates of the switching transistors 12-1 to 12-4 of the memory cells MC1 to MC4 are connected to word lines WL0 to WL3, respectively. The memory cell block BLK (i.e., node N1 of the memory cell block BLK) is connected to a bit line BL via a selection transistor 13. The gate of the selection transistor 13 is connected to a selection line SL. The node N2 is connected to a write line 14.

The following is an explanation about the configuration of the MTJ element 11 functioning as a magnetoresistive element. In this embodiment, a current-induced magnetization switching method is employed. According to the method, current directly flows through the MTJ element 11 to switch magnetization by the action of electron spin. In other words, the MTJ element 11 is a spin injection type magnetoresistive element, which is capable of switching magnetization by the supply of spin-polarized electrons.

The MTJ element 11 has a stacked structure comprising recording layer (free layer) 22, fixed layer (pinned layer) 22 and non-magnetic layer 23 interposed between these recording and fixed layers 21 and 22. The recording layer 21 comprises a ferromagnetic layer, and the magnetization direction is switched. The fixed layer 22 comprises a ferromagnetic layer, and the magnetization direction is fixed. The thickness of the fixed layer 22 is formed thicker than the recording layer 21 to fix the magnetization direction. Moreover, an anti-ferromagnetic layer is added to the ferromagnetic layer, and thereby, the magnetization direction may be fixed using exchange coupling. Thus, the magnetization of the fixed layer 22 receives no influence even if current flows through there.

Metal such as Fe, Co and Ni or alloy of those may be used as the ferromagnetic layer. Fe—Mn, Pt—Mn, Pt—Cr—Mn, Ni—Mn, Ir—Mn, NiO or $Fe_2O_3$ may be used as the anti-ferromagnetic layer. The non-magnetic layer 23 may be metal or insulator. Therefore, the MTJ element 11 has TMR effect if the non-magnetic layer 23 is insulator; on the other hand, it has GMR effect if the layer 23 is metal. If the non-magnetic layer 23 is an insulator, MgO and AlO (e.g., $Al_2O_3$) are used; on the other hand, if it is metal, Cu and Pt are used.

The following is an explanation about the operation of writing data in the MTJ element 11 having the foregoing configuration. FIG. 2 is a cross-sectional view to explain the case of writing data 1 in the MTJ element 11. FIG. 3 is a cross-sectional view to explain the case of writing data 0 in the MTJ element 11. In FIG. 2 and FIG. 3, each arrow shown in magnetic layers denotes the magnetization directions. In the first embodiment, current implies the flow of electron ($e^{13}$). That is, the case where a current flows from terminal T1 to terminal T2 is defined as a positive direction (+) of current (I).

In FIG. 2, current (—I) perpendicular to the plane flows through the MTJ element 11 from the fixed layer 22 to the recording layer 21 (from terminal T2 to terminal T1). By doing so, spin-polarized electrons are injected from the fixed layer 22 into the recording layer 21. In this case, electrons having a spin anti-parallel to the magnetization direction of the fixed layer 22 are reflected on the fixed layer 22. However, electrons having a spin parallel to the magnetization direction of the fixed layer 22 pass through the fixed layer 22, and thereafter, come into the recording layer 21.

The foregoing electron having parallel spin gives torque to a magnetic moment of the recording layer 21 so that the magnetization direction of the recording layer 21 becomes parallel with that of the fixed layer 22. By doing so, the fixed layer 22 and the recording layer 21 have the magnetization direction arranged in parallel with each other. When the foregoing parallel arrangement state is given, the MTJ element 11 has the minimum resistance value. This case is defined as data 1.

On the other hand, current (+I) perpendicular to the plane flows through the MTJ element 11 from the recording layer 21 to the fixed layer 22 (from terminal T1 to terminal T2). By doing so, spin-polarized electrons are injected from the recording layer 21 into the fixed layer 22. In this case, electrons having a spin anti-parallel to the magnetization direction of the fixed layer 22 are reflected on the fixed layer 22. Thereafter, the electrons return into the recording layer 21 in a state of keeping spin angular momentum (without changing the spin direction). The foregoing electron having anti-parallel spin gives torque to a magnetic moment of the recording layer 21 so that the magnetization direction of the recording layer 21 becomes anti-parallel with that of the fixed layer 22. By doing so, the fixed layer 22 and the recording layer 21 have the magnetization direction arranged in anti-parallel with each other. When the foregoing anti-parallel arrangement state is given, the MTJ element 11 has the maximum resistance value. This case is defined as data 0.

In the manner described above, data (i.e., data 1 or data 0) is recorded to the MTJ element 11. Data read is achieved in a manner of supplying a read current to the MTJ element 11, and detecting a change of the resistance value of the MTJ element 11.

The following is an explanation about the circuit operation of the MRAM shown in FIG. 1. First, a data write operation will be explained below. The selection line SL is activated, and thereby, the selection transistor 13 connected to the selection line SL is turned on. Thus, an arbitrary memory cell block BLK is selected.

One word line connected to the memory cell writing data is inactivated, and other word lines are all activated. Current having a flow corresponding to data (data 1 or data 0) is supplied to the memory cell block BLK using the bit line BL and the write line 14. By doing so, current flows through the switching transistor in the memory cell MC, which writes no data. On the other hand, current flows through the MTJ element 11 in the memory cell MC, which writes data. In the manner described above, current is supplied to only MTJ element 11 of arbitrary one of memory cells included in the memory cell block BLK.

The following is an explanation about the case of writing data in the MTJ element 11-2, for example. First, the selection line SL is activated, and thereafter, word lines WL0, WL2 and WL3 are activated and the word line WL1 is inactivated. By doing so, current supplied to the memory cell block BLK using bit line BL and write line 14 flows through the MTJ element 11-2 only.

A data read operation will be explained below. An operation of selecting an MTJ element carrying out data read is the same as the data write operation. A read current is supplied to the memory cell block BLK using bit line BL and write line 14. A resistance value (high and low resistance) of the MTJ element is read from the current value to determine data 1 and data 0. In this case, a read circuit (not shown) connected to the write line 14 reads the resistance value.

Figure 4:
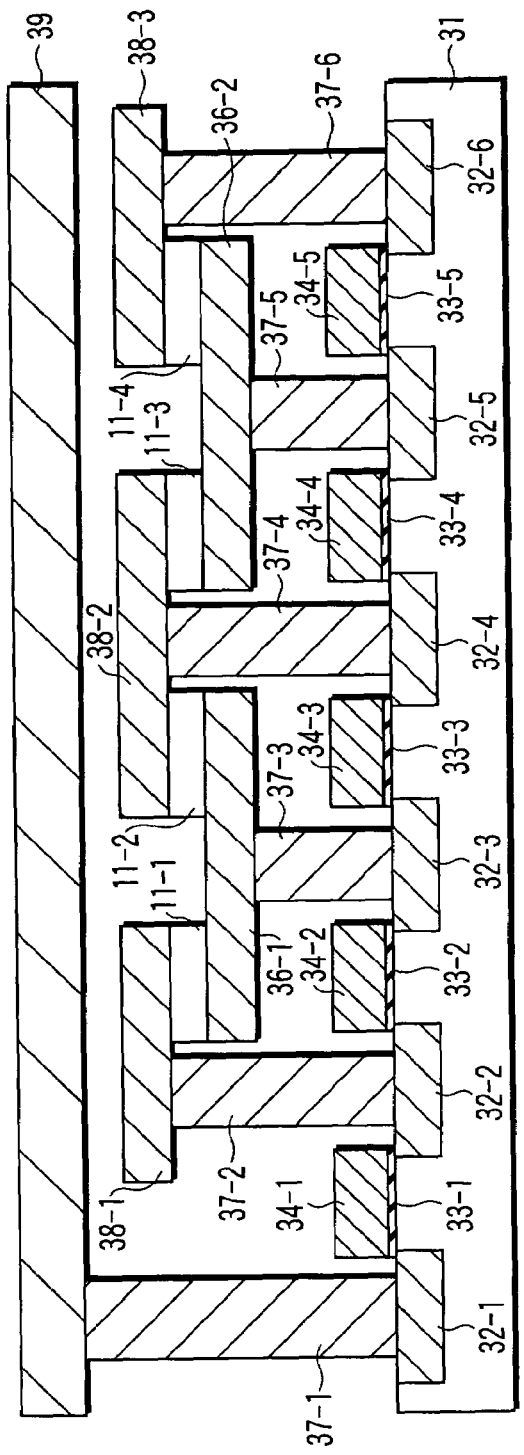
FIG. 4 is a cross-sectional view showing the configuration of the MRAM shown in FIG. 1.

The structure of the MRAM shown in FIG. 1 will be explained below. FIG. 4 is a cross-sectional view showing the configuration of an MRAM. In FIG. 4, there is no illustration (hatching) for interlayer insulating layers in order to readily understand the structure.

A P-type semiconductor substrate 31 (or P-type well provided in a substrate) is provided with selection transistor 13 comprising NMOS transistor and switching transistors 12-1 to 12-4. Specifically, gate electrodes 34-1 to 34-5 are provided on the semiconductor substrate 31 via gate insulating films 33-1 to 33-5, respectively, to extend to a Y direction. The gate electrode 34-1 corresponds to the selection line SL. Gate electrodes 34-2 to 34-5 correspond to word line WL0 to W3, respectively.

In the semiconductor substrate 31, both sides of individual gate electrodes 34-1 to 34-5 are provided with $N^+$-type diffusion regions 32-1 to 32-6 doped with $N^+$-type impurity of high-concentration. The $N^+$-type diffusion regions 32-1 to 32-6 function as source/drain regions of NMOS transistor. As shown in FIG. 4, two neighboring NMOS transistors share a source/drain region. This structure is possible because memory cells MC1 to MC4 are serial-connected as described in the first embodiment.

The selection transistor 13 is composed of gate electrode 34-1 and source/drain regions 32-1 and 32-2. The switching transistor 12-1 is composed of gate electrode 34-2 and source/drain regions 32-2 and 32-3. The switching transistor 12-2 is composed of gate electrode 34-3 and source/drain regions 32-3 and 32-4. The switching transistor 12-3 is composed of gate electrode 34-4 and source/drain regions 32-4 and 32-5. The switching transistor 12-4 is composed of gate electrode 34-5 and source/drain regions 32-5 and 32-6.

A bottom electrode 36-1 is provided above gate electrodes 34-2 and 34-3 via an interlayer insulating layer. The bottom electrode 36-1 is connected to the source/drain region 32-3 via a contact plug 37-3. A bottom electrode 36-2 is provided above gate electrodes 34-4 and 34-5 via an interlayer insulating layer. The bottom electrode 36-2 is connected to the source/drain region 32-5 via a contact plug 37-5. The foregoing bottom electrodes 36-1 and 36-2 function as a bottom electrode of MTJ element. For example, Ta is used as the material for these bottom electrodes 36-1 and 36-2.

The MTJ element 11-1 is provided on the bottom electrode 36-1 and above gate electrode 34-2. The MTJ element 11-2 is provided on the bottom electrode 36-1 and above gate electrode 34-3. That is, MTJ elements 11-1 and 11-2 share the bottom electrode. The MTJ element 11-1 is provided over the gate electrode 34-2. The MTJ element 11-2 is provided over the gate electrode 34-3.

The MTJ element 11-3 is provided on the bottom electrode 36-2 and above the gate electrode 34-4. The MTJ element 11-4 is provided on the bottom electrode 36-2 and above the gate electrode 34-5. That is, the MTJ elements 11-3 and 11-4 share the bottom electrode. The MTJ element 11-4 is provided over the gate electrode 34-4. The MTJ element 11-4 is provided over the gate electrode 34-5.

A top electrode 38-1 is provided on the MTJ element 11-1. The top electrode 38-1 is connected to the source/drain region 32-2 via a contact plug 37-2. A top electrode 38-2 is provided on the MTJ elements 11-2 and 11-3. That is, the MTJ elements 11-2 and 11-3 share the top electrode. The top electrode 38-2 is connected to the source/drain region 32-4 via a contact plug 37-4.

A top electrode 38-3 is provided on the MTJ element 11-4. The top electrode 38-3 is connected to the source/drain region 32-6 via a contact plug 37-6. Moreover, the top electrode 38-3 is connected to the write line 14 (not shown). For example, Ta is used as the material for these top electrodes 38-1 to 38-3.

A wiring layer (bit line BL) 39 is provided above top electrodes 38-1 to 38-3 via an interlayer insulating layer to extend to the X direction perpendicular to the Y direction. It is possible to make large the distance between top electrodes and the bit line BL. The wiring layer 39 is connected to the source/drain region 32-1 via a contact plug 37-1. For example, cu is used as the material for the wiring layer 39.

FIG. 5 is a plan view showing the lower layer section (section lower than bottom electrodes 36-1, 36-2) of the MRAM shown in FIG. 4. FIG. 6 is a plan view showing the upper layer section (upper section including bottom electrodes 36-1, 36-2) of the MRAM shown in FIG. 4. In FIG. 5, an active area (AA) denotes an area including source/drain regions 32-1 to 32-6 and channel regions between those.

As seen from FIG. 6, the MTJ element 11 has a shape of square in its plane. The MTJ element 11 may have a circular shape in its plane (see FIG. 7 which is a plan view showing the upper layer section of the MRAM). This structure is possible because the magnetoresistive element used in the first embodiment is a spin injection type. Here, the minimum feature size on design rule is defined as "F". In other words, the longitudinal and lateral length of the MTJ element 11 (or the diameter of the circle), contact diameter and gate length are all F. The foregoing "F" is determined depending on lithography accuracy in the generation.

The length of the memory cell MC in the Y direction (i.e., Y-direction length of active area AA) is 2F. Moreover, the length of the memory cell MC in the X direction (i.e., the sum of the X-direction length of MTJ element 11 and the length from MTJ element 11 to the center of contact plugs on both sides) is 2F.

Therefore, the size of the memory cell of this embodiment is $4F^2$ (2F×2F); as a result, the same cell size as NAND flash memory is realized. For example, the size of a magnetic write type memory cell is $12F^2$ in the minimum. Moreover, the size of a conventional spin injection type memory cell (i.e., memory cell having no chain structure) is $6F^2$ in the minimum.

Consequently, according to the first embodiment, the memory cell size can be reduced. This serves to reduce the area of the MRAM.

As depicted in FIG. 4, the MTJ element 11 is not directly connected to the bit line BL; therefore, the MTJ element 11 and the bit line BL are arranged in a state of being separated from each other. By doing so, it is possible to prevent an influence of a magnetic field generated by a current flowing through the bit line BL. As a result, this serves to reduce a write error to non-select cells.

Two neighboring transistors share one source/drain region in the circuit configuration. By doing so, the area of MRAM can be reduced.

One pair of two neighboring MTJ elements shares the bottom electrode. Moreover, another pair of two neighboring MTJ elements shares the top electrode. By doing so, the number of contact plugs is reduced; therefore, this serves to reduce the area of MRAM.

In the first embodiment, switching transistor 12 and selection transistor 13 each comprise a NMOS transistor; however, the present invention is not limited to the NMOS transistor. For example, these transistors may comprise a PMOS transistor. In this case, an N-type semiconductor substrate is used as the semiconductor substrate 31, and the source/drain region 32 is formed as a $P^+$-type diffusion region.

(Second Embodiment)

Figure 8:
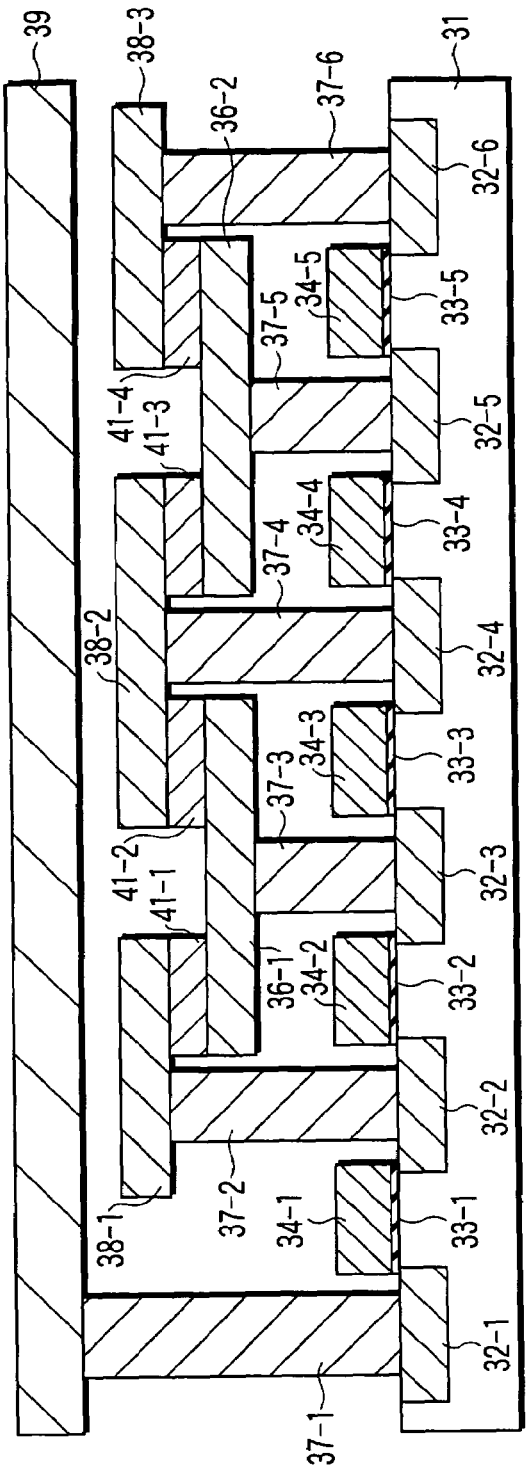
FIG. 8 is a cross-sectional view showing a PRAM according to a second embodiment of the invention.

According to the second embodiment, a phase change element is used as a recording element of a memory cell MC in place of the magnetoresistive element. In other words, the second embodiment relates to a phase change random access memory (PRAM). FIG. 8 is a cross-sectional view showing the PRAM according to the second embodiment.

Memory cells MC include phase change elements 41 (41-1 to 41-4) as recording elements. The phase change element 41 comprises a phase change film as a recording layer. The phase change film is interposed between bottom electrode 36 and top electrode 38. The phase change film is changed in its phase from a crystalline state to an amorphous state or from an amorphous state to a crystalline state. This phase change occurs resulting from heat generated by supplying a current from the top electrode 38 toward the bottom electrode 36. Chalcogen compounds such as Ge—Sb—Te, In—Sb—Te, Ag—In—Sb—Te and Ge—Sn—Te are given as the material for the phase change film. The given materials are preferable to secure high-speed switching characteristic, repetitive recording stability and high reliability.

The following is an explanation about the operation of writing data in the memory cell MC. The data write operation is carried out in the following manner. A pulsed current is supplied to the phase change film. The phase change film is heated by current pulse. A current value of the current pulse is set so that the temperature of the phase change film becomes more than a crystallizing threshold temperature TH. The crystallizing threshold temperature TH is temperature when changing from a crystalline state to an amorphous state. The temperature of the phase change film heated by a supply of current pulse rapidly falls after the supply of current pulse. At that time, the phase change film becomes an amorphous state (high resistance state).

On the other hand, a low current having a low current value is supplied to the phase change film, following the foregoing pulsed current. In this case, the temperature of the phase change film heated by the supply of current pulse falls; however, it gradually falls due to the supply of the low current. At that time, the phase change film becomes a crystalline state (low resistance state).

In other words, the phase change film heated by the current is heated more than the crystallizing threshold temperature TH. If temperature fall with respect to crystallizing threshold temperature TH is small according to the fall condition of the supplied current pulse, the phase change film becomes a crystalline state (low resistance state). On the other hand, if the temperature fall with respect to crystallizing threshold temperature TH is large, the phase change film keeps an amorphous state (high resistance state).

The case where the phase change film is in the amorphous state (high resistance state) is defined as data 0. On the other hand, the case where the phase change film is in the crystalline state (low resistance state) is defined as data 1. By doing so, binary data is written in the memory cell MC. The current supplied to the phase change film is set by controlling the bit line BL and the write line 14. Data read is the same as the MRAM described in the first embodiment.

According to the second embodiment, the chain structure of the memory cell MC is applicable to the PRAM. Therefore, the area of the PRAM is reduced like the foregoing first embodiment.

Figure 9:
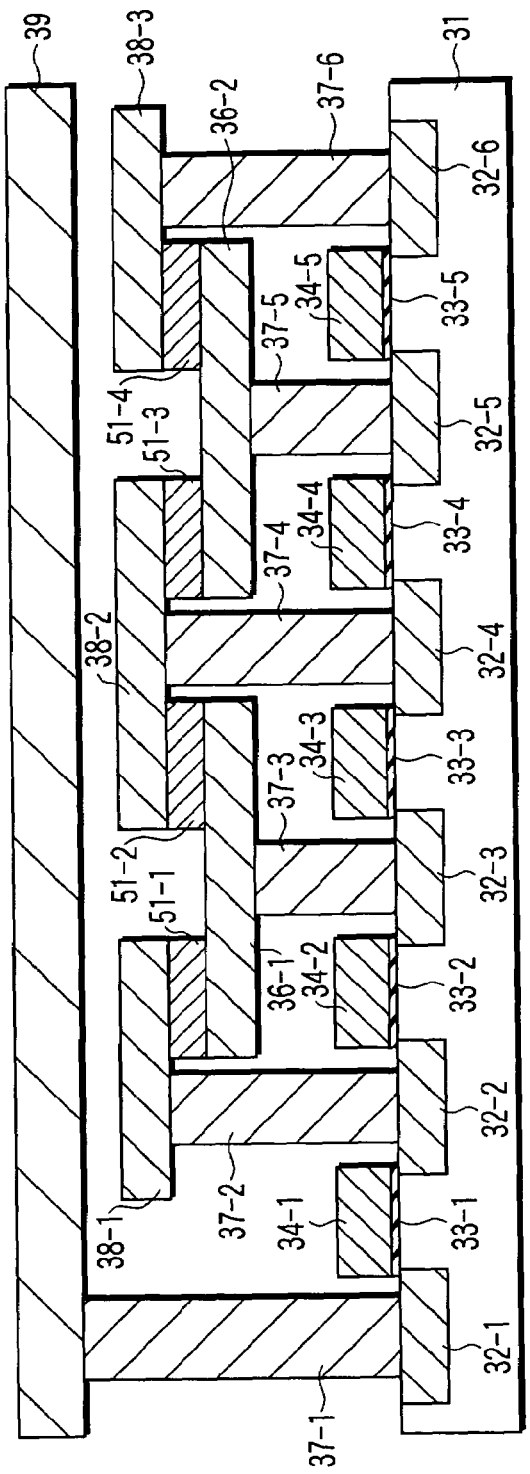
FIG. 9 is a cross-sectional view showing an RRAM according to the second embodiment.

In addition, the present invention is applicable to an RRAM (Resistance RAM). FIG. 9 is a cross-sectional view showing the RRAM. In memory cells MC of the RRAM, colossal magnetoresistive (CMR) films 51 (51-1 to 51-4) are used as recording layers. The resistance value of the CMR film 51 largely changes according to the sign of a supplied voltage pulse. For example, $Pr_{0.7}Ca_{0.3}MnO_3$ is used as the material for the CMR film 51. Moreover, Pt is used as the material for top and bottom electrodes 38 and 36.

A resistance change of the CMR film 51 is associated with data 0 and data 1, and thereby, data is written in the memory cell MC. The voltage pulse supplied to the CMR film 51 is set by controlling bit line BL and write line 14. As described above, even if the chain structure is applied to the PRAM, the same effect as the first embodiment is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell block including a plurality of memory cells connected in series between first node and second node, the memory cells including a magnetoresistive element and a switching transistor, which are connected in parallel, the magnetoresistive element being a spin injection type and including a fixed layer whose magnetization direction is fixed, a recording layer whose magnetization direction changes, and a non-magnetic layer interposed between the fixed layer and the recording layer;
    a bit line connected to the first node via a selection transistor;
    a word line connected to a gate of the switching transistor;
    a write line connected to the second node; and
    a top electrode and bottom electrode provided via the magnetoresistive element,
    wherein the top electrode and the bottom electrode supply a current perpendicular to a plane to the magnetoresistive element, and the magnetization direction of the recording layer changes by spin-polarized electrons included in the current.

2. The semiconductor memory device according to claim 1, wherein to write data in the memory cells, the memory cell block is supplied with a current flowing from the first node to the second node or from the second node to the first node via the bit line and the write line.

3. The semiconductor memory device according to claim 1, further comprising:
    a selection line connected to a gate of the selection transistor.

4. The semiconductor memory device according to claim 1, wherein the magnetoresistive elements of the memory cells are arranged along a first direction,
    a first pair of two neighboring magnetoresistive elements share the bottom electrode,
    a second pair of two neighboring magnetoresistive elements share the top electrode, and the first pair and the second pair share a magnetoresistive element.

5. The semiconductor memory device according to claim 4, wherein the switching transistor includes: a gate electrode provided on a semiconductor substrate via a gate insulating film to extend to a second direction perpendicular to the first direction, and corresponding to the word line; and source/drain regions provided on both sides of the gate electrode in the semiconductor substrate, and two neighboring switching transistors share a source/drain region.

6. The semiconductor memory device according to claim 5, wherein the magnetoresistive element is arranged over the gate electrode.

7. The semiconductor memory device according to claim 4, wherein the magnetoresistive element is circular or square in its plane.

8. The semiconductor memory device according to claim 4, wherein the bit line extends to the first direction, and is arranged above the top electrode.

9. The semiconductor memory device according to claim 5, further comprising:

a first contact plug corresponding to the bottom electrode, and connecting the bottom electrode to one of the source/drain regions; and a second contact plug corresponding to the top electrode, and connecting the top electrode to one of the source/drain regions.

10. The semiconductor memory device according to claim 1, wherein the recording layer comprises a ferromagnetic material, and the fixed layer comprises a layer stacking a ferromagnetic material and a anti-ferromagnetic materials.

* * * * *